(12) United States Patent  
Singhal et al.

(10) Patent No.: US 7,412,674 B1  
(45) Date of Patent: Aug. 12, 2008

(54) SYSTEM AND METHOD FOR MEASURING PROGRESS FOR FORMAL VERIFICATION OF A DESIGN USING ANALYSIS REGION

(75) Inventors: Vigyan Singhal, Fremont, CA (US); Brajesh Arora, Cupertino, CA (US); Yann Antonioli, San Jose, CA (US)

(73) Assignee: Jasper Design Automation, Mountain View, CA (US)

( * ) Notice: Subject to any disclaimer, the term of this patent is extended or adjusted under 35 U.S.C. 154(b) by 145 days.

(21) Appl. No.: 11/089,851

(22) Filed: Mar. 24, 2005

Related U.S. Application Data

(60) Provisional application No. 60/556,677, filed on Mar. 26, 2004.

(51) Int. Cl.  
*G06F 17/50* (2006.01)

(52) U.S. Cl. .......................................... 716/5

(58) Field of Classification Search ............... 716/4–6, 716/1–2, 10–11  
See application file for complete search history.

(56) References Cited

U.S. PATENT DOCUMENTS

| | | | |
|---|---|---|---|
| 6,102,959 A | 8/2000 | Hardin et al. | |
| 6,185,516 B1 | 2/2001 | Hardin et al. | |
| 6,594,804 B1 | 7/2003 | Hojati | |
| 6,609,229 B1 | 8/2003 | Ly et al. | |
| 6,651,228 B1 | 11/2003 | Narain et al. | |
| 6,725,431 B1 | 4/2004 | Yang | |
| 6,772,402 B2 | 8/2004 | Mortensen | |
| 7,065,726 B1* | 6/2006 | Singhal et al. | 716/5 |
| 2004/0123254 A1 | 6/2004 | Geist et al. | |
| 2004/0194046 A1* | 9/2004 | Singhal et al. | 716/11 |
| 2005/0268265 A1* | 12/2005 | Ly et al. | 716/6 |

OTHER PUBLICATIONS

Beer, I. et al., "RuleBase: An Industry-Oriented Formal Verification Tool," 33rd Design Automation Conference, DAC 1996.

* cited by examiner

*Primary Examiner*—Paul Dinh  
(74) *Attorney, Agent, or Firm*—Fenwick & West LLP

(57) ABSTRACT

A method and apparatus for measuring the progress of a formal verification process using an analysis region, and measures the effectiveness of the current set of properties/requirements in verifying different portions of logic within the design. The present invention applies the concept of analysis region to analyze the properties/requirements for a design. The analysis region can be expanded or contracted either manually or automatically based upon the results of the analysis. The present invention generates a visual display that is available to the user that represents the amount of source code in the analysis region for a given property or multiple properties in comparison to the maximum possible analysis region. The present invention can display this information in a bar graph format, on a line-by-line basis for the source code and on a waveform display, for example.

22 Claims, 15 Drawing Sheets

SYSTEM AND METHOD FOR MEASURING PROGRESS FOR FORMAL VERIFICATION OF A DESIGN USING ANALYSIS REGION

RELATED APPLICATIONS

This application claims priority from U.S. provisional application No. 60/556,677, filed on Mar. 26, 2004, which is incorporated by reference herein in their entirety. This application is related to U.S. patent application Ser. No. 10/745,993 filed on Dec. 24, 2003, which is incorporated by reference herein in its entirety.

FIELD OF THE INVENTION

This invention relates generally to the field of functional verification of digital designs, and specifically to the field of formal verification of a design with respect to a set of requirements.

BACKGROUND OF THE INVENTION

The present invention relates generally to the field of functional verification of digital circuit designs. More specifically, the present invention relates to the field of formal verification of a digital circuit design and verifying the behavior of a circuit model to satisfy specified properties.

Recent increases in the complexity of modern integrated circuits have exacerbated the difficulty of verifying design correctness. The verification phase of a typical integrated circuit design project consumes approximately 70-80% of the total time and resources dedicated to a project. Flaws in the design that are not found during the verification phase have significant economic impact in terms of increased time-to-market and reduced profit margins.

A typical design flow for integrated circuit design includes many steps that proceed sequentially, with each step depending on the results of the previous steps. Consequently, when a flaw is discovered in a step, all the previous steps must be repeated, often at a significant cost. Hence, it is highly desirable to find and fix design flaws as early as possible in a design flow.

Traditionally, simulation-based techniques have been used to verify design correctness. Transistor-level simulation based techniques were used in the early 1970s and logic gate-level simulation based techniques were used in the late 1980s. As the complexity of designs increased with the passage of time, drawbacks associated with these techniques came into light. These techniques became less effective because of their inability to completely and quickly verify large designs. A popular alternative is the use of Register Transfer Language (RTL)-level simulation. Contemporary verification and debugging tools use various levels of abstractions for defining design specifications. These abstractions are expressed in high-level description languages. High-level description languages provide a number of functionalities for analyzing and verifying a design while performing simulation. For example, a designer can navigate the design hierarchy, view the RTL source code, and set breakpoints on a statement of an RTL source code to stop the simulation. Also, line numbers are provided in the RTL source code to identify different lines and statements. Further, the verification and debugging tools often support viewing and tracing variables and some times even signal values. These RTL-level simulation tools typically also offer these and other types of RTL debugging functionalities.

The verification tools as mentioned above typically follow a design flow. In the first step of the design flow, the conceptual nature of the integrated circuit is determined. The desired functionality of a circuit is expressed as a collection of properties or specifications, and possibly as a model of the behavior in a high-level language such as C++. The RTL model of the digital circuit is built based upon knowledge of the specifications or the high-level model. The RTL model is expressed in a hardware description language (HDL) such as Verilog or VHDL available from IEEE of New York, N.Y. Many other steps such as synthesis, timing optimization, clock tree insertion, place and route, etc., yield subsequent transformations of the design. These transformations eventually result in a set of masks that are fabricated into integrated circuits. The current invention is targeted at finding design flaws in the RTL model of the design, which is a very early phase of the design flow.

In the design flow, creation of RTL source code is followed by verification in order to check the compliance of the RTL source code to the design specifications. Three approaches commonly used to verify the design at the RTL level are simulation, emulation and formal methods.

Simulation is one of the most prevalent methods used to determine whether the design is in accordance with the specifications by simulating the behavior of the RTL model. The simulation process uses RTL source code and a "Testbench" to verify a design. The Testbench contains a subset of all possible inputs to the circuit/logic. For an 'n' input circuit, there are $2^n$ possible input values at any given time. For large n, e.g., for a complex design, the number of possible input sequences becomes prohibitively large. To simplify this, only a subset of all possible input sequences is described in any given Testbench. An example of such a tool is SMV from Carnegie Mellon University, Pittsburgh, Pa. To simulate the RTL model, a Testbench must be created to provide appropriate input stimulus to the RTL model. Creating the Testbench is a time consuming process. The process of simulating the Testbench is also time consuming. Furthermore, it is effectively impossible to create enough test cases to completely verify that the specified properties of the design are true. This is because of the sheer number of possible input sequences, and also because it requires in-depth knowledge and tremendous creativity on the part of the Testbench creator to imagine the worst-case scenarios.

An increasingly popular alternative is to use formal methods to completely verify properties of a design. Formal methods use mathematical techniques to prove that a design property is either always true, or to provide an example scenario (referred to as a counterexample) demonstrating that the property is false. One category of tools using formal methods to verify properties are known as Model Checkers. An example of a conventional model checking tool is the Formal-Check tool from Cadence Design Systems, Inc. of Santa Clara, Calif.

Traditionally, simulation has been used to verify the functionality of a digital design in an ad-hoc manner. When simulation is used, progress is tracked by, for example: (1) the number of tests created (random, constrained random, or directed) to generate stimulus, (2) the percentage (%) of input space simulated (for example, in processors with instruction architecture), (3) the percentage of lines in the design description that have been exercised by tests, (4) the extent in which signal values are toggled by the tests, (5) the extent in which finite state machines transit from a specific state to another specific state as exercised by the tests, and (6) the % of items in the test plan have corresponding tests. To measure these items, a combination of the following techniques can be used:

'code-coverage', 'line-coverage', 'branch-coverage', 'sub-expression-coverage', 'state-coverage', 'arc coverage', and 'functional coverage', for example.

When a design team starts to use formal verification, these metrics become less useful, because formal verification analyzes all possible legal sequences of inputs (subjected to constraints) and formal verification leads to an emphasis on the completeness of the set of requirements, whereas simulation concentrates on the stimulus generation (and simulation checkers are not analyzed for completeness). As a result, there is a need to define new metrics to measure progress in the use of formal verification to verify a digital design.

One such conventional system for measuring coverage on a design is the use of a cone of logic with respect to a property. For example, *RuleBase: an Industry-Oriented Formal Verification Tool*, Ilan Beer, Shoham Ben-David, Cindy Eisner, and Avner Landver, $33^{rd}$ Design Automation Conference, DAC 1996, which is incorporated by reference herein in its entirety. In this paper, the authors identify the cone of logic as the relevant portion of the design with respect to a property and states that if the formula verifies a property of one design output, only this output and its input cone of logic are necessary. The RuleBase paper identifies unnecessary parts and removes them."

Other references use a "cone of logic" to determine if more properties should be written. However, the use of analysis region (which is the same or smaller than the full cone of logic) to formally verify a property means that a coverage metric using the cone of logic does not provide a good indication of how many properties should be written to completely verify a block. On the other hand, in the present invention, because an analysis region should be tuned to be as small as possible to achieve a fast true proof, this provides a good balance between achieving complete analysis region coverage and achieving minimal analysis region for fast formal verification.

What is needed is a system and method for (1) measuring the progress of a formal verification process using the concept of an analysis region, (2) measuring the effectiveness of the current set of properties/requirements in verifying different portions of logic within the design and (3) having a visualization display that communicates the measurement succinctly to the user.

SUMMARY OF THE INVENTION

The present invention presents a method and apparatus for measuring the progress of a formal verification process using an analysis region, and measures the effectiveness of the current set of properties/requirements in verifying different portions of logic within the design. The present invention applies the concept of analysis region to analyze the properties/requirements for a design. The analysis region can be expanded or contracted either manually or automatically based upon the results of the analysis. The present invention generates a visual display that is available to the user that represents the amount of source code in the analysis region for a given property or multiple properties in comparison to the maximum possible analysis region. The present invention can display this information in a bar graph format, on a line-by-line basis for the source code and on a waveform display, for example.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

FIG. 12 is an illustration of a graphical user interface (GUI) showing the percentage of the analysis region compared to the MPAR and where the code is identified as being in the analysis region, outside the analysis region but inside the MPAR or in neither using highlighted text according to one embodiment of the present invention.

DETAILED DESCRIPTION OF THE INVENTION

Figure 1A:
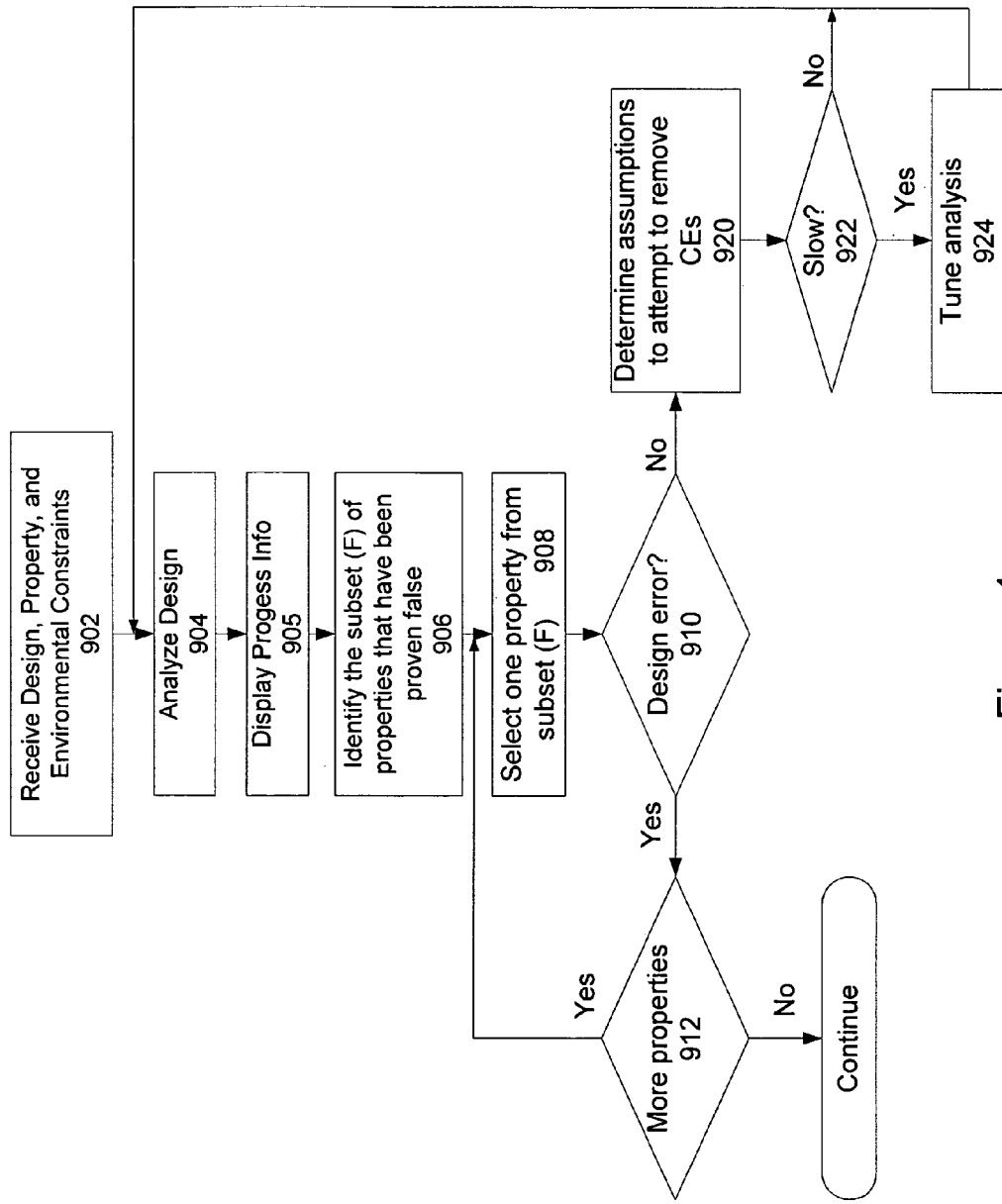
FIG. 1*a* is a flowchart illustrating how false negatives can be removed by providing feedback on the cost and effects of possible assumptions that are provided by the user or generated automatically in accordance with one embodiment of the present invention.

A preferred embodiment of the present invention is now described with reference to the figures where like reference numbers indicate identical or functionally similar elements.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

Recently, a new use model for formal verification has shown success in improving the practicality of formal verification. The new use-model breaks down the generation of a formal proof into multiple steps, and allows the user to provide insight about the design between steps through the manual analysis of the intermediate results. This approach can be described using the flow chart in FIGS. 1a and 1b.

The flow chart shown in FIG. 1a guides users to remove false negatives by providing feedback on the cost and effects of possible assumptions that are provided by the user or generated by the tool. With reference to FIG. 1a, the present invention receives 902 a design and properties/requirements. The invention analyzes 904 the design using, for example, the process set forth in U.S. patent application Ser. No. 10/745,993, filed on Dec. 24, 2003 that is incorporated by reference herein in its entirety. In one embodiment the present invention displays/presents 905 progress information. Additional details about this step is set for the below with reference to step 955. The present invention then identifies 906 the subset (F) of properties that have been proven false and selects 908 one property from this subset (F). If the user decides 910 that the result is because of a design error, the invention determines 912 whether additional properties exist. If so, the process continues and another property from the subset (F) is selected 908. Otherwise, the process ends. If 910 the result is not because of a design error, then the invention determines 920 assumptions that are necessary to attempt to remove counterexamples (this process is described in greater detail below with reference to step 962). Then the user determines 922 whether the process was too slow. If the process was too slow, the invention tunes 924 the analysis as described below with reference to FIG. 2. The process continues and the design is analyzed 904 again.

Figure 1B:
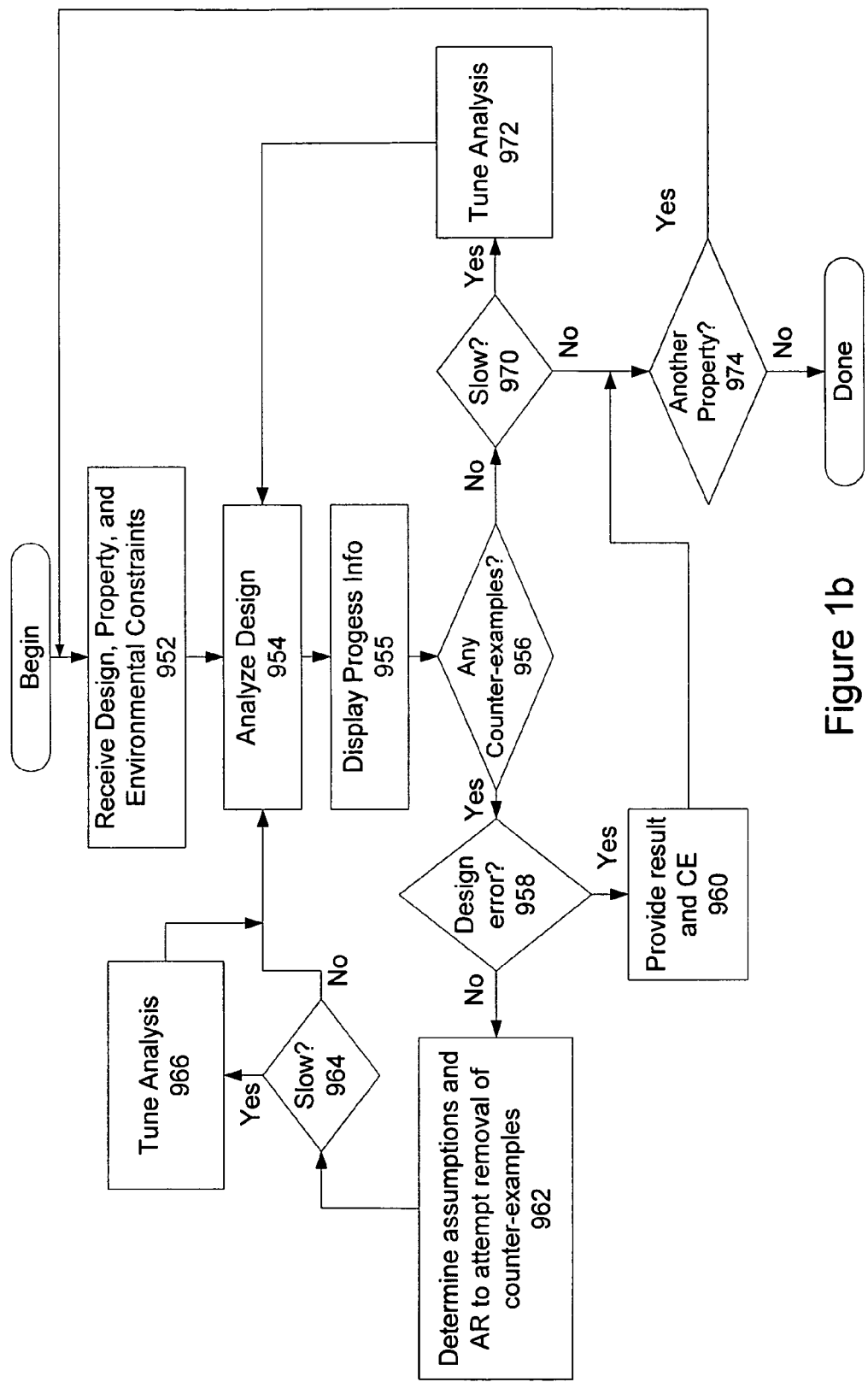
FIG. 1*b* is a flowchart depicting a method to verify a property in accordance with one embodiment of the present invention.

A flow chart that depicts a more complete embodiment is set forth in FIG. 1b, which handles methodologies that use the concept of an analysis region (AR). A more detailed description of the use of an analysis region is set forth in U.S. patent application Ser. No. 10/389,316, which is incorporated by reference herein in its entirety. The present invention includes providing feedback to the users so that the user can evaluate the cost and effects of an action on the manipulation of the environmental constraints and/or analysis region before he actually directs the tool to take the action.

FIGS. 1a-b describe a method in accordance with an embodiment of the present invention for verifying a property of a given circuit model in conjunction with a set of environmental constraints while providing the user with relevant information, for example, cost and effect along with progress information, regarding possible modifications to the environmental constraints and the analysis regions. With reference to FIG. 1b, the circuit description, a property to be verified and an initial set of environmental constraints are received 952 by the system as inputs from the user. The design is analyzed 954, for example, using the method described above, to determine if a requirement is satisfied in context of the environmental constraints and the initial analysis region as determined by the tool. For ease of discussion, when the entire design is being analyzed we refer to this as the analysis region being the entire design.

The present invention analyzes 954 the design and determines whether the requirement is always true or not. If the requirement is not always true, counterexamples are generated, as described above. In an embodiment of the present invention information about the progress of the verification is identified and presented 955 to the user. As described in greater detail below, the analysis region can be manually or automatically modified by expanding or contracting it (or a combination of expanding one portion and contracting another portion of the analysis region) (see steps 962, 966 and 972, for example). The present invention then analyzes 954 the modified design and displays or presents 955 updated progress information to the user. The progress information can relate to the progress for verifying a single property or to multiple properties. In alternate embodiments, this information can be presented to the user continuously, upon request or at other times and is not restricted to merely the position in the flowchart set forth in FIG. 1b.

In one embodiment, the analysis region is determined using the technique described below, for example. The maximum potential analysis region (MPAR) is initially defined as the fan-in signals for the one or more properties of interest and is modified based upon changes in the analysis region. It is the minimum amount of logic required to prove a property true. Logic outside of the MPAR does not contribute to verifying the property. For example the MPAR may be reduced when the analysis region is tuned, as described below. The analysis region can be expanded by adding signals and can be reduced (tuned) by removing signals. The modifications can be done automatically or manually. One example of manual modification is described below in which the user is presented with information regarding the costs or savings of modifying the analysis region prior to the manual modification. In the situation where the analysis region is reduced or tuned by removing some logic/code, the MPAR is similarly reduced or tuned by having the same logic/code removed from the MPAR. The MPAR is also automatically reduced to equal the analysis region when the one or more properties of interest are verified. Thus, when the one or more properties of interest is verified, the analysis region is equal to the MPAR and the bar graph illustrates that the analysis region is 100% of the MPAR. Additional details describing several embodiments of the present invention and the techniques that can be used to determine and modify the analysis region are set forth below.

The type of information displayed or presented 955 can include a bar graph representing the percentage of code in the analysis region compared to the percentage of code in the maximum potential analysis region. Alternate presentations can include a display of the source code with the code highlighted or otherwise identified depending upon when the code is part of the analysis region, is part of the MPAR but not in the analysis region, and/or is outside the MPAR. More details about some of the possible presentation formats are described below with reference to FIGS. 8-13.

If one or more counter-examples are generated by the analysis 954, the counterexamples are presented to the user. The user determines 958 if the counterexample represents a design error or a false negative. If the user determines that the counterexample represents a design error, then the analysis conclusion and the counterexamples are provided 960 to the user and the verification process ends for this property. The present invention determines 974 if there is another property to verify. If there is another property, it is selected and the verification process starts for the selected property at 952, otherwise, the verification process terminates.

Figure 3:
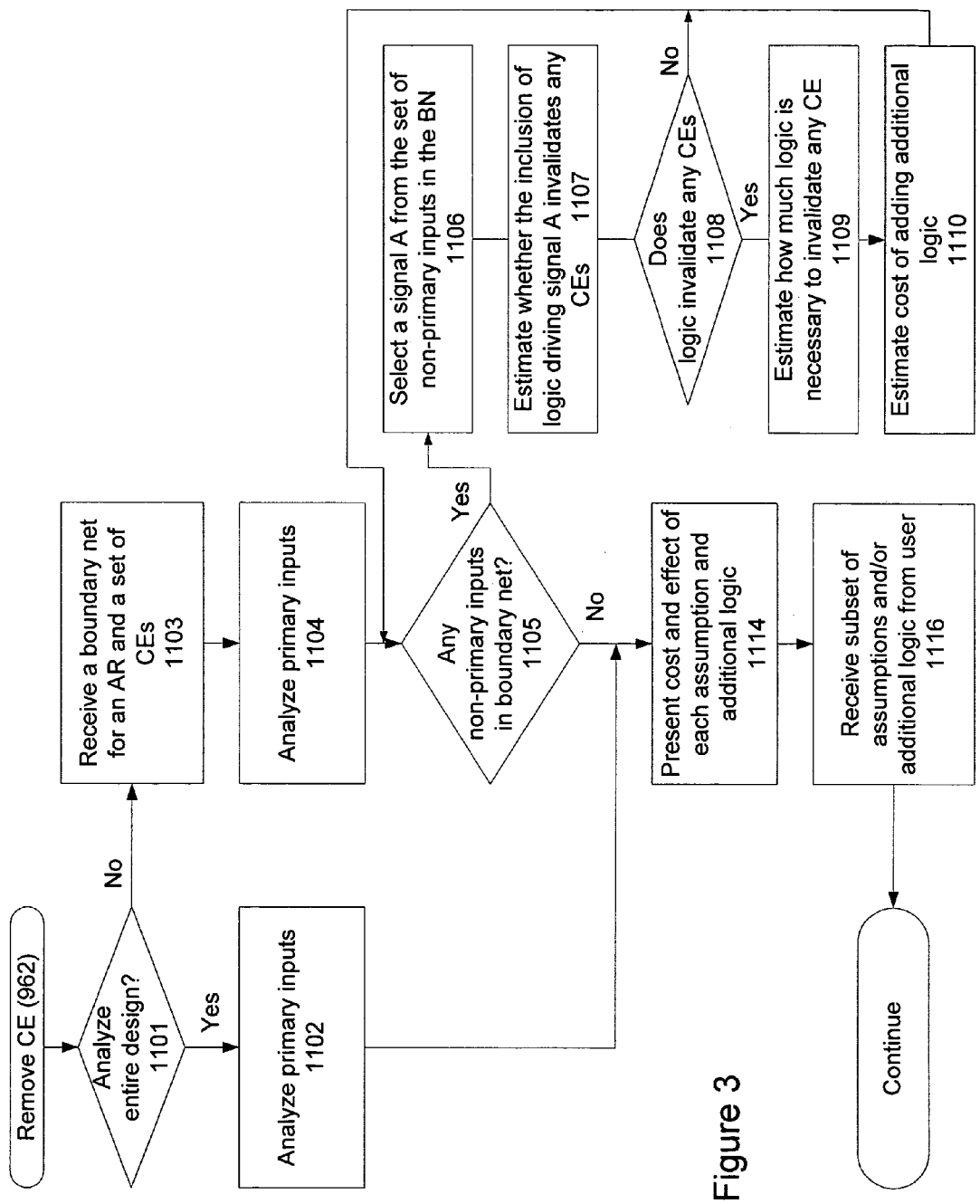
FIG. 3 is a flowchart illustrating the method of identifying assumptions and/or modifications to the analysis region for eliminating the identified counterexample(s) according to one embodiment of the present invention.
Figure 5:
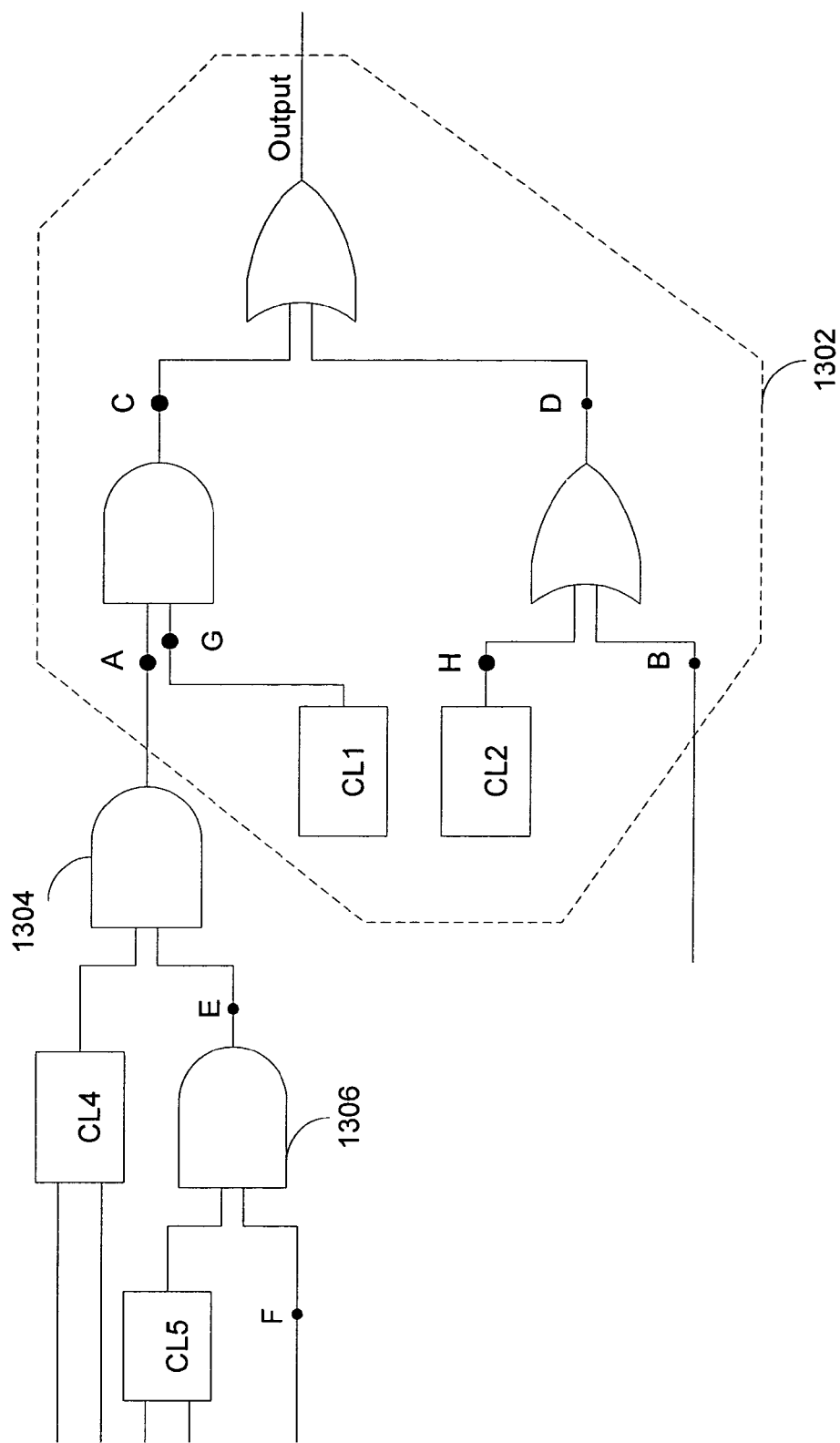
FIG. 5 illustrates an example of a design to be verified and includes an initial analysis region.

If the user determines 958 that the counterexamples do not correspond to a design error, then the present invention helps the user eliminate the counterexamples by identifying 962 the cost and effect of assumptions and/or modifications to the analysis region. A more detailed description of this process is illustrated in FIG. 3. FIG. 3 is a flowchart illustrating the method of identifying assumptions and/or modifications to the analysis region for eliminating the identified counterexample(s) according to one embodiment of the present invention. With reference to FIG. 3, if the analysis region is a subset 1101 of the entire design being analyzed then the present invention receives 1103 a set of nets for the analysis region (AR) and a set of counterexamples (CEs). FIG. 5 illustrates an example of a design to be verified and includes an initial analysis region 1302. With reference to the example in FIG. 5, the present invention receives 1103 the set of boundary nets as signal "A", primary signal "B" and the primary inputs driving complex logic CL1 and CL2 (the inputs are not shown). The present example has one assumption, F=0 and presumes that the user is attempting to prove that the output is equal to zero at all times (Output==0). Two counterexamples are identified, CE1 and CE2.

$$A{=}{=}1\&\&B{=}{=}X \quad (CE1)$$

$$B{=}{=}1\&\&A{=}{=}X \quad (CE2)$$

Figure 4:
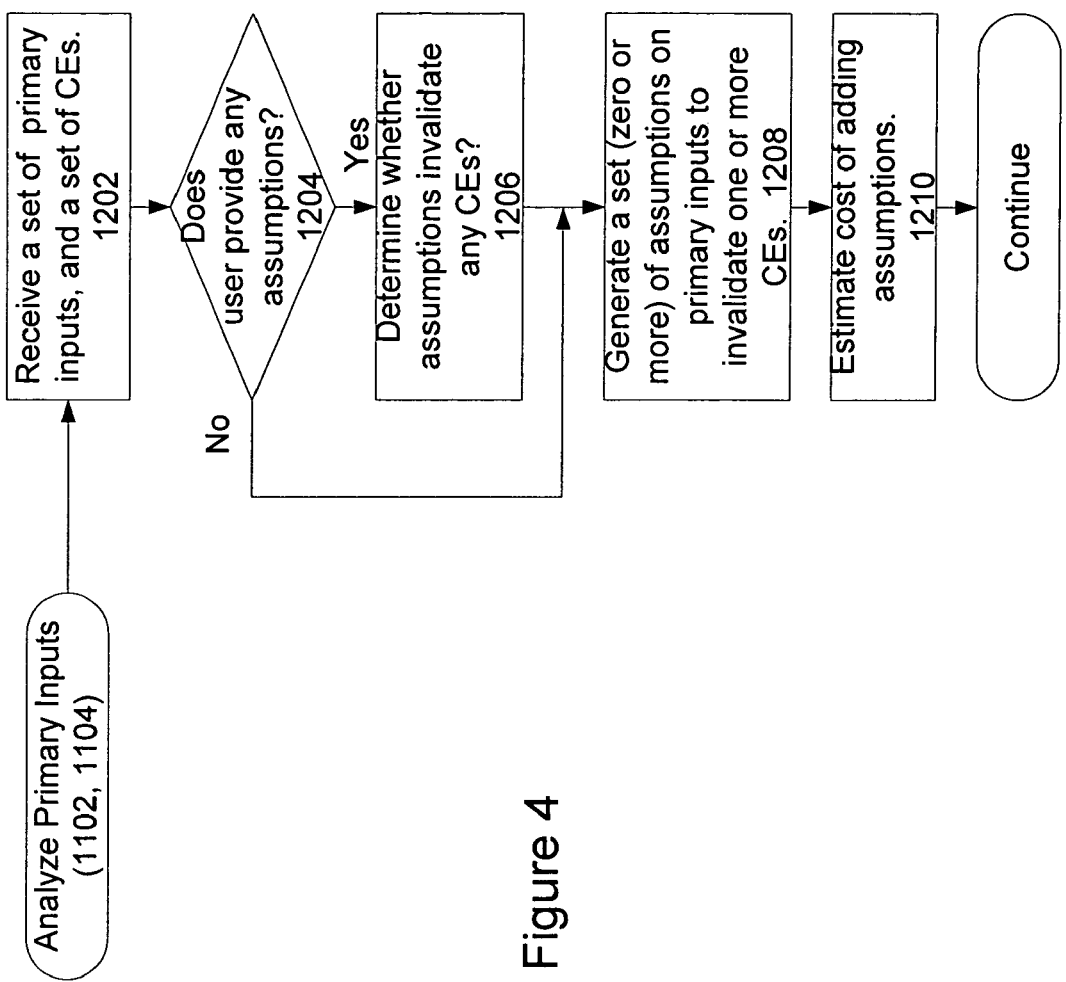
FIG. 4 is a flowchart illustrating a method for analyzing primary inputs according to one embodiment of the present invention.

The present invention then analyzes 1104 the primary inputs. In this example signal B is the only primary input (into the analysis region 1302) that is relevant to the two counterexamples. A more detailed description of the step of analyzing 1104 the analysis region is set forth in FIG. 4. FIG. 4 is a flowchart illustrating a method for analyzing primary inputs according to one embodiment of the present invention. With reference to FIGS. 4 and 5, the present invention receives 1202 a set of primary inputs (signal B) and a set of counterexamples (CE1 and CE2). If the user provides 1204 one or more assumptions then the present invention determines 1206 whether any of the assumptions invalidates any of the counterexamples. In this example, the user does not provide any assumptions on signal B so the process continues by generating 1208 a set of assumptions on primary inputs that invalidates one or more counterexample. All of the identified primary inputs (in this example, signal B) are compared against the counterexamples to determine whether an assumption can be identified that will eliminate a counterexample. In this example, primary signal B is compared with CE1. However, in CE1 signal B is a "don't care" so any assumption for signal B will not eliminate CE1. For counterexample CE2 the value of B is equal to 1 so the present invention identifies the assumption B==0 as an assumption that will eliminate CE2.

The present invention can then estimate 1210 the cost/savings of adding assumptions. The cost/savings can correspond to a variety of factors that affect the performance of the verification. For example, (1) the size of the corresponding binary decision diagram (BDD) used to capture the assumption gives a quantitative indication of the speed of any operation that involves such an assumption. The larger the BDD, the slower the analysis will become; (2) the assumption may also simplify the analysis by causing other assumptions or logic in the design to become irrelevant to the analysis. For example, if an assumption "B==1" is introduced, because of the OR-gate between signal B and D, the signal D will have the value 1 regardless of the value in the signal H and the activities in CL2. The size of the corresponding BDD used to capture CL2 gives a quantitative indication of the resulting speed up; (3) instead of using a Boolean expression on existing signals in the design as an assumption, an assumption may assume the input to have the same value as a signal being driving by an arbitrary complex logic. In this case, it may capture temporal behavior. The cost or saving of including this assumption depends on the characteristics of the logic: (a) the size of the corresponding BDD used to capture the logic gives a quantitative indication of the speed of any operation involving this assumption, (b) a counter-like behavior in this logic leads to more iterations in the analysis, and therefore, the range of possible values in this counter gives a quantitative indication of the number of iterations required to complete the analysis, (c) a datapath-like behavior in this logic leads to more states to be maintained as reachable set during the analysis, and therefore, the width of the datapath gives a quantitative indication of the complexity in manipulating the reachable set.

There are also other possibilities regarding the cost/saving of adding an assumption, as we take into account for generic and application-specific design characteristics, such as the use of FIFO, memory, decoder, pipeline logic, etc. By providing feedback on the cost or savings of making this assumption, the user may make an educated decision about whether to make the current assumptions, or spend more time in devising a better assumption, or even incorporate appropriate abstraction into the assumption. The present invention may also suggest appropriate abstraction for specific characteristics of the logic.

In this example, the savings of adding the assumption B==0 is not significant since the assumption will not eliminate the need to analyze any significant block of logic. That is, since signal B and signal H are inputs to an OR gate, even if signal B is zero, the output of the OR gate (signal D) will still depend upon the output (signal H) of the complex logic block CL2. Therefore, even with this assumption complex logic block CL2 needs to be analyzed. However, the BDD corresponding to "B==0" is also small. Therefore, overall, adding the assumption will not introduce high overhead either, and it will probably reduce the states being stored in the reachable set. As a result, the tool will conclude that it won't have adverse effect on the performance, and it is probably advantageous to add it in order to eliminate the counterexample CE2. The process then continues with the flow returning to FIG. 3.

The present invention continues by determining 1105 if there are any non-primary inputs in the boundary nets of the analysis region 1302. A signal is selected 1106, and then the present invention estimates 1107 whether the inclusion of this signal in the analysis region invalidates any of the counterexamples. For example, in an embodiment of the invention, the answer may be estimated through a 3-value simulation of the full design using values from the counterexample for the primary inputs. If the logic invalidates 1108 a counterexample, the present invention estimates 1109 how much logic is necessary to invalidate any counterexample. Otherwise, the present invention determines if there are any other non-primary inputs in the boundary net 1105. The present invention estimates 1109 the amount of logic using an intelligent traversal of the netlist representing the design. This traversal can be performed using a conventional depth first search (DFS) algorithm. During the traversal, the search explores the part that is inconsistent when the values from the counterexample and from the simulation are different. In the example of FIG. 5, the only boundary net that is not a primary input is signal A (signal B is a primary input). The present invention identifies the logic driving signal A as an AND-gate 1304 that is driven by signal E and complex logic block CL4. Since the value of A is 1 in CE1, the present invention determines whether E or CL4 must be 0 or not. If so, it would invalidate CE1. During the DFS, the next signal being considered is E, and the present invention identifies that it is the output of an AND gate 1306 having inputs of signal F and complex logic block CL5. Therefore, the present invention checks whether F or CL5 must be 0 or not. Since an initial assumption the invention received at step 902 is that signal F is equal to 0, the present invention determines that with F==0 then signal E must be zero and subsequently signal A must be equal to zero. If A==0, then counterexample CE1 is invalidated since it requires signal A to be equal to one. Accordingly, the present invention estimates 1109 that adding the two AND-gates (1304, 1306) and the assumption "F==0" to the current analysis will invalidate CE1. Furthermore, since F==0, complex logic block CL5 does not need to be analyzed since its output has no effect on the verification. Similarly, since E==0, complex logic block CL4 does not need to be analyzed since its output has no effect on the verification. The present invention then estimates 1110 the cost of adding additional logic. As described above, a variety of measures can be used to estimate the cost/savings of adding additional logic. In this case, instead of dealing with a Boolean expression as an assumption, we are dealing with the logic driving the boundary nets. As a result, the complexity of the logic as determined by the size of the BDD used to capture the logic is usually higher than an assumption. Furthermore, it is also important to analyze cost or saving according to the characteristics of the logic, such as whether it is a counter, a datapath, a memory, a decoder, etc.

In this example the cost of adding additional logic includes the cost of adding two AND gates 1304 and 1306. However, the cost of complex logic blocks CL4 and CL5 are not included since the output of these complex logic blocks has no effect on the output. As a result, the corresponding BDD represents a three-input AND-gate. Furthermore, if we combine this BDD with the BDD corresponding to the assumption "F==0", we can simplify the analysis into a BDD that says A==0, which is even simpler than the three-input AND-gate. Furthermore, since the invention has identified that the assumption F==0 infers A==0, then the value of signal G has no effect on the output (since if A==0 then C==0). Accordingly, the present invention includes in the cost estimation the cost saved by eliminating the logic (CL1) driving signal G. The cost savings can be estimated based upon the size of the BDD representing the CL1 logic, and also whether the CL1 logic is a counter or not, etc.

After estimating the cost and effect of each assumption and additional logic to the analysis region, the invention presents 1114 the cost and effect to the user using a graphical user interface or other technique to provide the user with the information, e.g., sending the information to a file. The present invention provides the assumptions, effect and cost generated in step 1104 or 1102 (discussed below) along with the cost and effect of adding logic as determined in steps 1108 and 1110. The invention may also prioritize the assumptions by their effects and costs, and extract analysis such as "adding assumption A will lead to a faster analysis than adding assumption B" or "adding both assumptions A and B will remove all existing counterexamples, but will slow down the analysis". It may also suggest possible abstraction in order to incorporate a certain assumption with reduced cost. The invention may also prioritize adding additional logic by their effects and costs, and extract analysis such as "adding the logic driving signal A will remove the existing counterexample, but will slow down the analysis".

In this example, the present invention outputs the assumption B==0, the effect of the assumption, i.e., an indication that this assumption will eliminate counterexample CE2, and the cost of adding this assumption which in this example is not significant—and can be elaborated as the size of additional BDDs, e.g., 10. The present invention suggests adding the additional logic driving signal A, the effect of adding the logic, i.e., an indication that this assumption will eliminate CE1, and the cost of adding the additional logic including the savings of removing other logic (CL1) which is not needed. The present invention then receives 1116 a selection of the assumptions and/or additional logic from the user. The user may select all, some, or none of the possibilities generated by the present invention and may provide other assumptions or logic that have not been suggested by the present invention.

If the verification is of a complete design 1101, e.g., if the analysis region is the entire design to be verified, then the present invention analyzed 1102 primary inputs. The details for analyzing 1102 the primary inputs is described above with reference to step 1104 and FIG. 4. After analyzing 1102 the primary inputs the cost and effect of each assumption is presented 1114 to the user and the invention receives 1114 a subset of the assumptions from the designer as described above. In this case, during the tuning 916 of the analysis, described below, one embodiment of the invention may focus on removing or changing assumptions, and therefore may keep the analysis region as the full design. Another embodiment may focus on adding assumptions or removing logic from the design to form an analysis region that is not the entire design.

Figure 6:
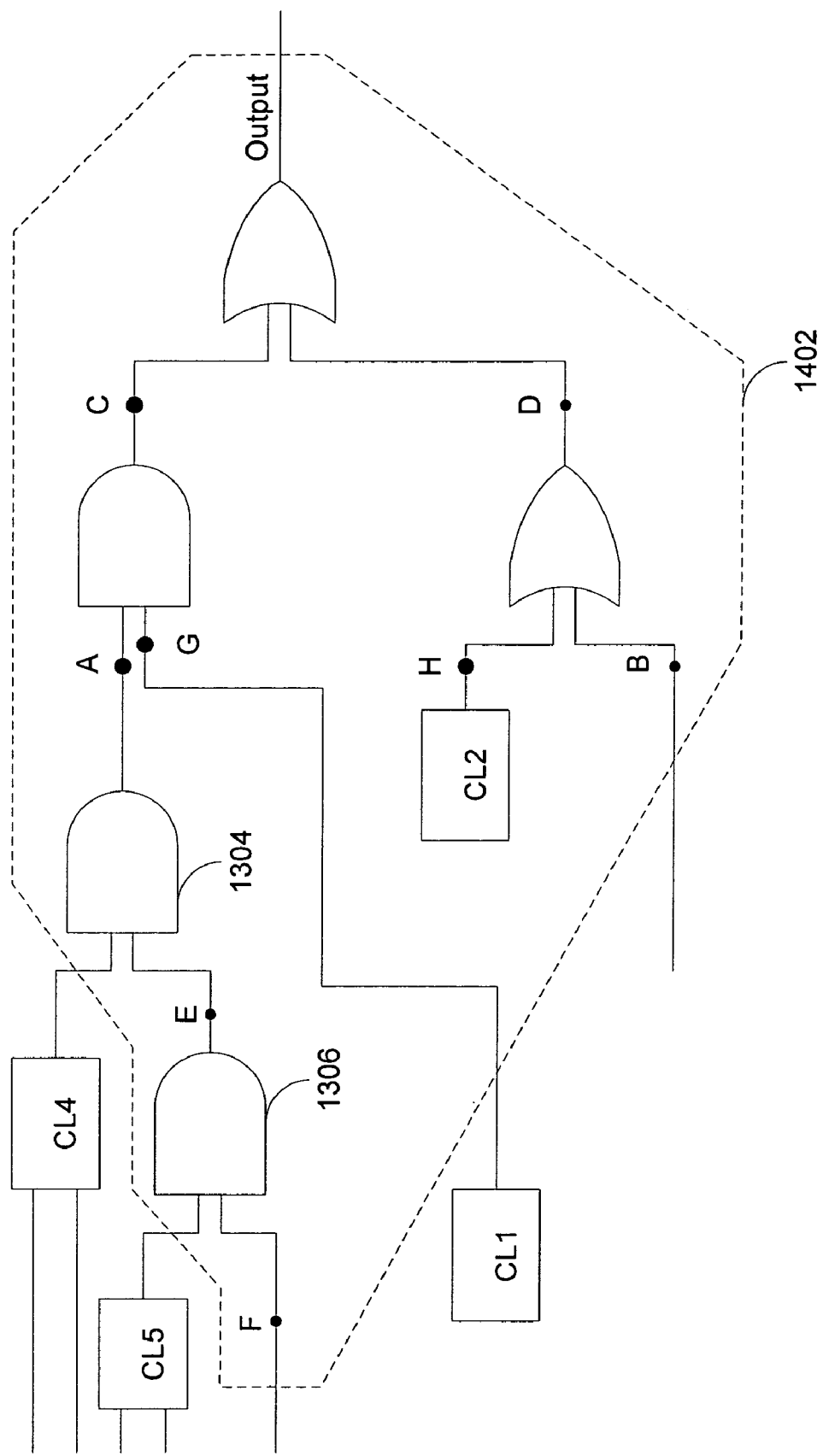
FIG. 6 illustrates an example of a design to be verified including a modified analysis region.

In the present example, the user elects to utilize the additional logic driving the signal A (including AND gates 1304 and 1306) and the assumption B==0. Thus the analysis region 1402 changes as illustrated in FIG. 6. FIG. 6 illustrates an example of a design to be verified with the modified analysis region.

After identifying 962 potential assumptions and potential analysis regions to attempt removal of counterexamples, the present invention receives 964 an indication from the user as to whether the verification process was too slow. It is not uncommon for verification process to take several hours for complex designs. If the process is too slow, the present invention provides options and information to the user regarding how to decrease the verification time by tuning 966 the analysis. Details about analysis tuning 966 are described in detail in FIG. 2.

Figure 2:
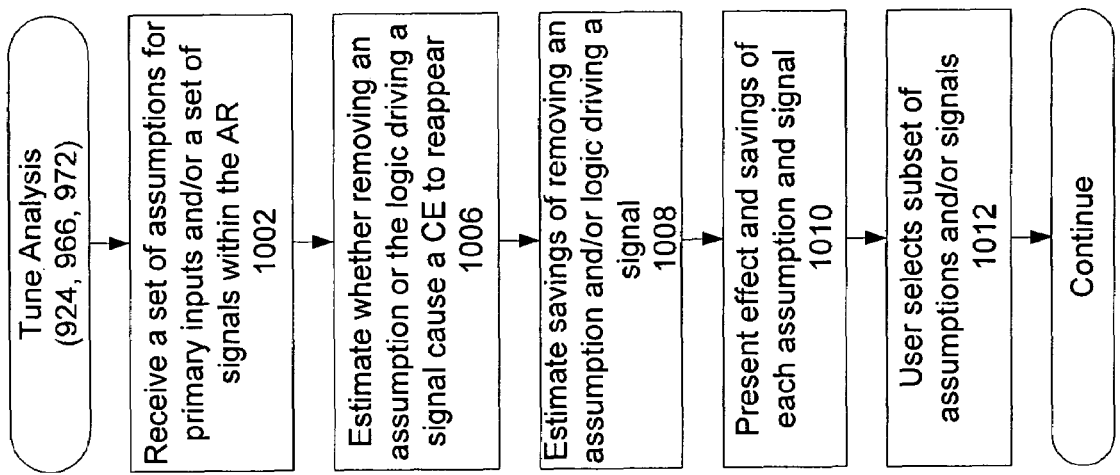
FIG. 2 illustrates a method for tuning the analysis according to one embodiment of the present invention.

FIG. 2 illustrates a method for tuning the analysis according to one embodiment of the present invention. The present invention receives 1002 a set of assumptions for primary inputs and/or a set of signals within the analysis region. In the example described above and illustrated in FIG. 6, the current set of assumptions for the primary inputs is:

B==0

F==0.

In this example signals within the analysis region include signals C, D, H, A, E, etc. In step 1002, either the tool selects a subset of these signals to be analyzed, or the user manually identifies them. Presume the signal H is selected. The analysis region 1402 is being analyzed and the set of stored counterexamples are CE1 (A==1 && B==X) and CE2 (B==1 && A==X). As described above, the goal is to prove that the output is zero at all times. In this example, there are no outstanding counterexamples since the user accepted the assumption and additional logic to eliminate the counterexamples in step 962. However, in other examples, counterexamples may exist but their existence does not change the tuning analysis 966 process according to one embodiment of the present invention. Since the process steps can be accomplished differently, e.g., steps 964 and 966 can occur prior to 962, in an alternate embodiment, the analysis tuning step can account for whether making another assumption or adding/removing logic will eliminate an existing counterexample.

The present invention estimates 1006 whether removing an assumption or logic driving a signal will cause a previously invalidated counterexample to once again become a valid counterexample. The present invention iteratively analyzes each assumption and logic that drives a signal to determine whether such a known counterexample becomes valid. In this example, the present invention analyzes the situation where the assumption B==0 is eliminated and determines that eliminating this assumption has no effect on the first counterexample CE1 but will cause the second counterexample CE2 to become valid once again. Similarly, the present invention analyzes the situation where the assumption F==0 is eliminated and determines that eliminating this assumption has no effect on the counterexample CE2 but will cause the counterexample CE1 to become valid once again. The invention then analyzes whether removing the logic driving signal H will cause a previous counterexample to become valid. In this example, removing the logic driving signal H (CL2) will not cause either CE1 or CE2 to reappear.

The present invention then estimates 1008 the cost savings of removing each assumption and each collection of logic driving a signal. Removing the assumption B==0 will not result in any significant cost increase because no logic has been eliminated because of this assumption. In contrast removing the assumption F==0 will result in a significant cost increase because the cost of analyzing complex logic blocks CL1, CL4 and CL5 (or alternatively only CL1, since CL4 and CL5 can be eliminated by modifying the analysis regions) is significant in this example and may have a complexity on the order of several thousand because of the sizes of the BDDs for three pieces of logic. Because of the complication introduced by the logic blocks originally rendered irrelevant by the assumption, the current embodiment presents several alternatives regarding the assumption "F==0". For example, putting back CL1, CL4, and CL5 so that the cost would be high, or, alternatively, keeping out CL1, CL4, and CL5 so that the cost would be low but the chances of causing a new counterexample to appear is high. Removing the complex logic driving signal H (CL2) will also result in a cost savings based upon, for example, the size of the BDD representing the CL2 logic. The cost information and the effect on previous (or existing) counterexample information is presented 1010 to the user and the user may select 1012 none or one or more of the assumptions and/or logic driving signals. In addition, the present invention permits the user to enter assumptions or modify the logic to be analyzed that the present invention does not present. In this example, the user elects to eliminate the logic (CL2) that drives signal H.

Note that while the removal of the logic CL2 will not cause the previously invalidated counterexamples to reappear, it will lead to a new counterexample that represents a false negative, as removing CL2 enables H to take value 0 or 1 at any time.

The procedure continues by analyzing 954 the design with the modifications selected by the user. In this iteration of the design analysis, one counterexample (CE3) is identified.

H==1&&B==X&&F==X

That is, the output is equal to 1 when signal H is equal to 1. The present invention identifies 956 that a counterexample exists and the user indicates 958 that the counterexample is not the result of a design error. Then the present invention attempts to remove the counterexample in step 962. As described above, step 962 is described in greater detail in FIG. 3. Since the entire design 1101 is not being analyzed, the present invention receives a set of boundary nets for the analysis region along with the currently valid counterexamples, i.e., CE3. Eventually the present invention detects the addition of logic CL2 will invalidate CE3 and the user may select to add CL2 back into the analysis region.

The present invention then analyzes 1104 the primary inputs (signals B and F) as described above with reference to FIG. 4. The present invention identifies whether the user has added 1204 any additional primary input assumptions. In this example, no additional assumptions are added so the present invention attempts to generate a set of assumptions on primary inputs that will eliminate counterexamples. Neither signal B or signal F will have any effect on CE3 since both are "don't care" in CE3. The process continues by determining 1106 whether any logic drive the inputs to the analysis region 1402. Complex logic block CL2 drives signal H, which is an input to the analysis region. Note that CL2 is the logic that was previously eliminated from the analysis region in step 966. The present invention estimates 1108 how much logic is necessary to invalidate any counterexample. In this example, the invention estimates 1108 that entire block CL2 should be added to the analysis region. The invention then estimates 1110 the cost of adding CL2 back, and presents 1114 the cost and effect of adding the logic to the user. In the example, the user elects to add CL2 back despite the cost because it eliminates a counterexample and the present invention receives 1116 this instruction.

In this situation the user does not indicate 964 that the analysis is too slow and the design is analyzed 954 once again. No counterexamples are generated 956 by the design analysis 954. The user is then provided an opportunity to indicate 970 whether the analysis was too slow. If the analysis was not too slow, then the process determines 974 if there are any more properties to verify. If there are properties to verify, then process continues at 952, otherwise the process ends. If the analysis was too slow the present invention tunes 972 the analysis. The process for tuning 972 the analysis is the same as the process described above with reference to step 966. The analysis tuning 972 process is described in greater detail with reference to FIG. 2. The invention receives 1002 the set of assumptions for primary inputs and/or signals within the analysis region, as set forth above. Then the invention estimates 1006 whether removing an assumption or logic driving a signal will cause a counterexample to reappear. At this point the invention will analyze the assumptions with reference to counterexamples CE1, CE2 and CE3. In addition, the logic driving signal H (CL2) is analyzed. However, since the previous iteration of step 1006 (which was called from step 964), a new counterexample was identified and eliminated, i.e., CE3. In estimating 1006 whether the removal of complex logic CL2 will cause a counterexample to reappear, the removal of CL2 is compared to CE3 (H==1). Removing the logic CL2 may result in the reappearance of CE3, and this information is presented 1010 to the user along with the other effects and savings 1008. The user decides 1012 whether to make any modifications to the assumptions or signals, in this example the user decides that no additional modifications are necessary. In one embodiment the invention continues by analyzing 954 the design. In another embodiment, since no changes occurred in the analysis tuning 972 step, the process ends.

The above examples only have combinational logic so the cost can be determined easily using, as one factor, the size of the BDD representing the logic. However, when sequential logic is in the design different factors are used to determine the cost/complexity. In addition the system also operates with other design elements, e.g., multiplexors. Additional details regarding their operation is set forth in U.S. patent application Ser. No. 10/745,993, filed on Dec. 24, 2003 which is incorporated by reference herein in its entirety.

During the analysis of the intermediate results, the user would examine a counterexample on the current analysis region, and determine whether the current analysis region needs to be modified, whether new assumptions need to be added and whether the counterexample indicates a real bug in the design.

Because of the use of an analysis region a user may be interested in how much additional modification to the analysis region may be needed. As described above, the present invention provides a method and apparatus to measure progress toward a complete proof of one or more properties/requirements by providing the user with information about the size of the analysis region compared to the size of the MPAR for one or more properties.

As described above, conventional systems use the concept of "cone of logic" as coverage metric for formal analysis. However, since the use of analysis region, which is a subset of the cone of logic, can fully verify a property, progress metrics based upon that the cone of logic does not provide a good indicator of either (1) the progress of the verification or (2) how many additional properties are needed to completely verify a section of the design (or the complete design).

Conventional solutions concentrate on providing a coverage metric to determine whether an existing set of properties provide enough coverage of a design, instead of measuring progress in the formal verification of one or more properties. The present invention provides a solution for both of these goals.

As described above, the present invention presents a method and apparatus for measuring the progress of a formal verification process using an analysis region, and measures the effectiveness of the current set of properties/requirements in verifying different portions of logic within the design. The present invention applies the analysis region to analyze the properties/requirements for a design. The analysis region can be expanded or contracted either manually or automatically based upon the results of the analysis. The present invention generates a visual display that is available to the user and represents the amount of source code in the analysis region for one or more properties of interest in comparison to the maximum possible analysis region for the one or more properties of interest. The present invention can display this information in a bar graph format, on a line-by-line basis for the source code and/or on a waveform display, for example.

Figure 7A:
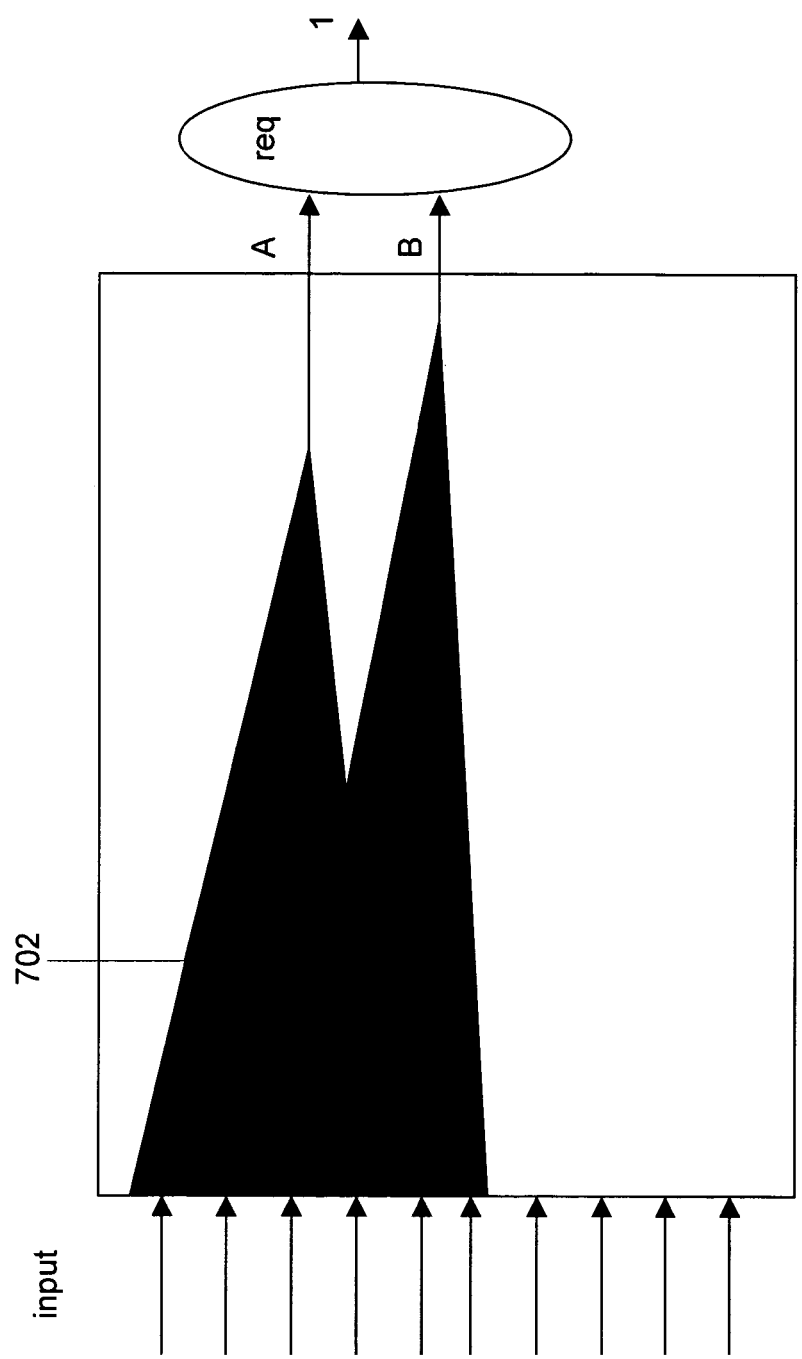
FIG. 7*a* is an illustration depicting the maximum possible analysis region (MPAR) for the combination of properties A and B according to one embodiment of the present invention.

FIG. 7a is an illustration depicting an initial maximum possible analysis region (MPAR) 702 for the combination of properties A and B according to one embodiment of the present invention. Properties A and B refer to two signals that can be a verification requirement. The MPAR 702 for signals A and B is highlighted in black in FIG. 7*a*, which can be obtained by recursively going through the fan-in signals of A and B, passing through all internal signals and flops all the way to the primary inputs of the design.

Figure 7B:
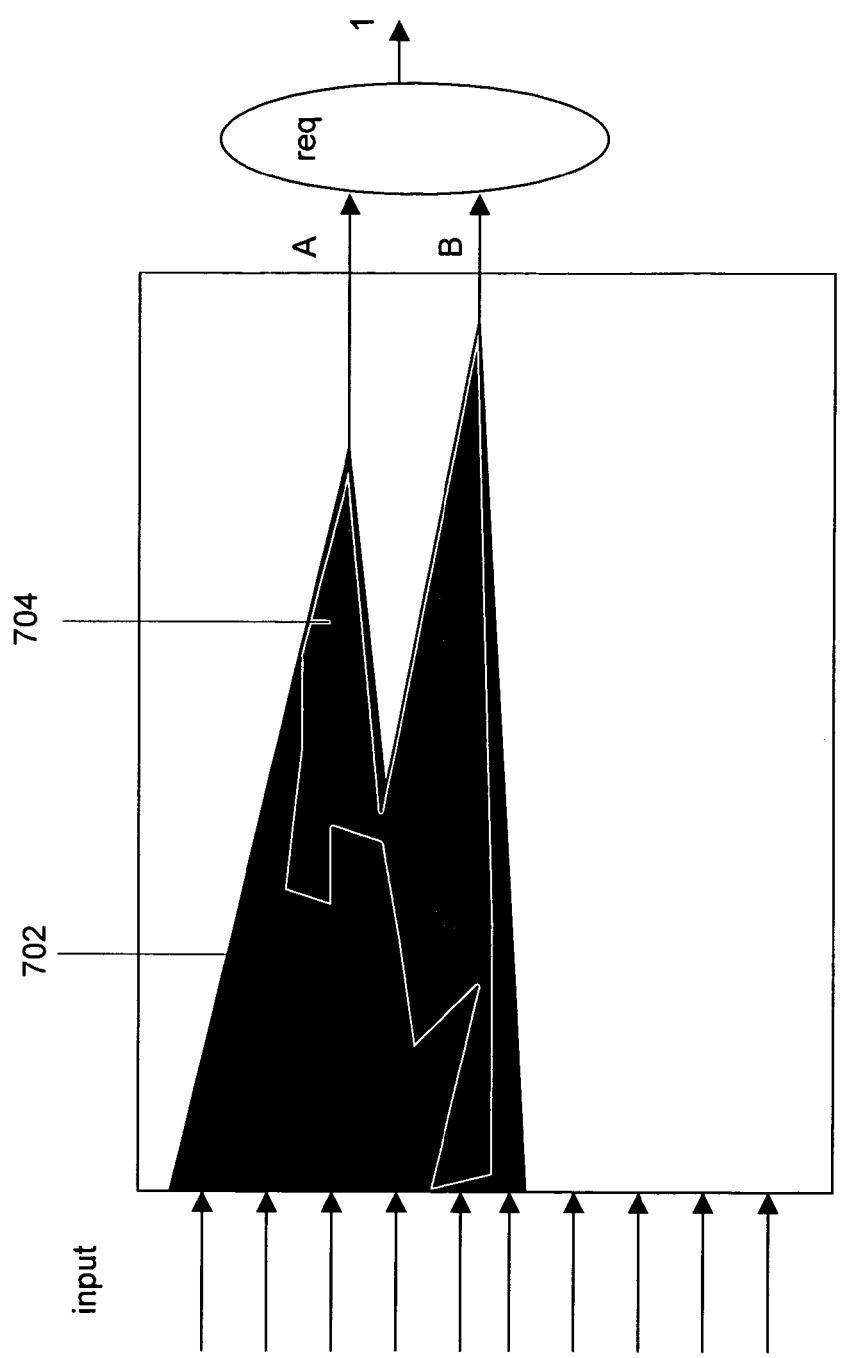
FIG. 7*b* is an illustration depicting the maximum possible analysis region (MPAR) and the current analysis region for the combination of properties A and B according to one embodiment of the present invention.

The analysis region for the requirement is a subregion of the MPAR 702, that is created through the formal verification testbench using the process described above with reference to FIGS. 1-6. FIG. 7*b* is an illustration depicting the maximum possible analysis region (MPAR) 702 and the current analysis region 704 for the combination of properties A and B according to one embodiment of the present invention.

Figure 8:
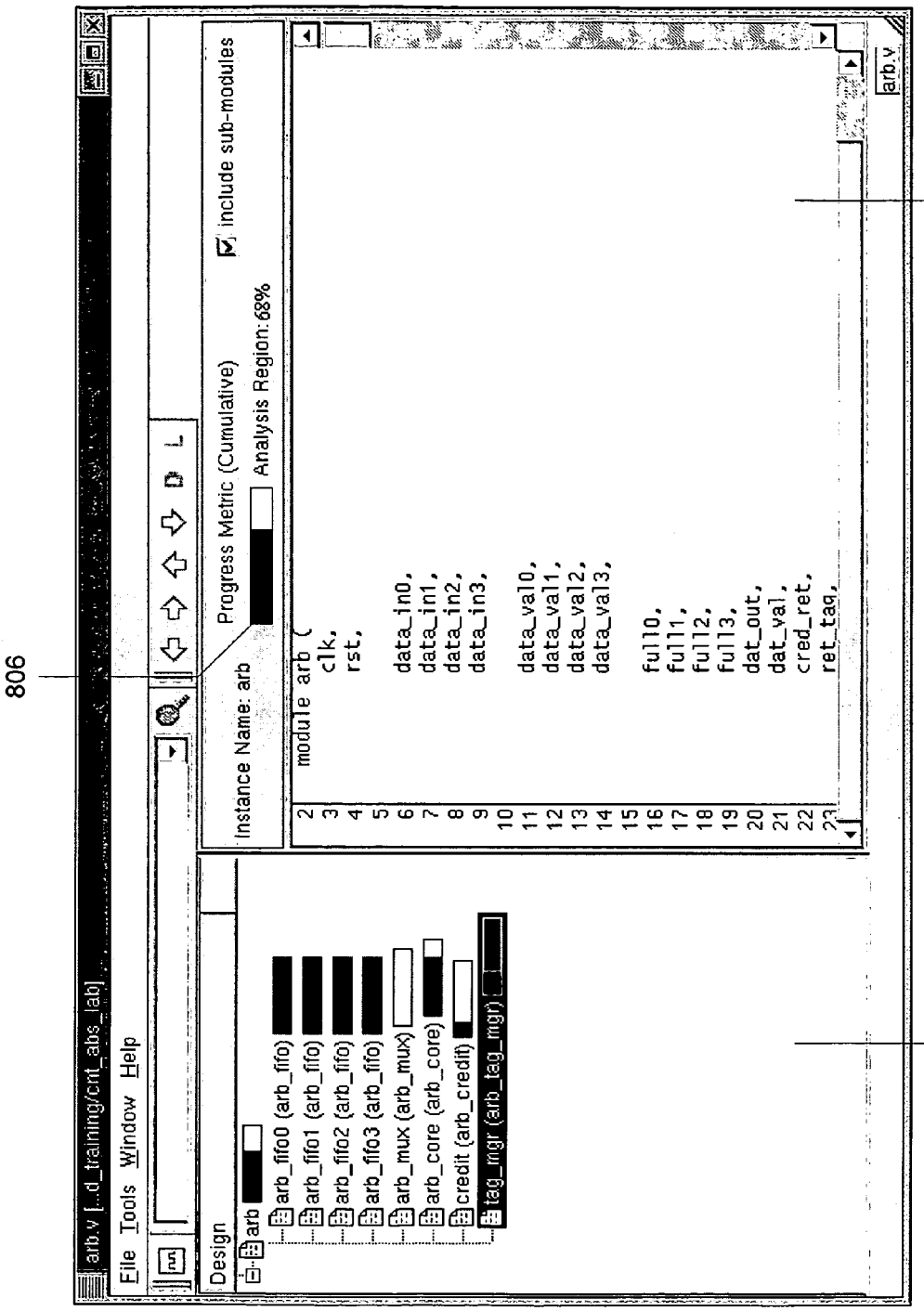
FIG. 8 is an illustration of a graphical user interface (GUI) showing the percentage of code in the analysis region compared to the MPAR according to one embodiment of the present invention.

FIG. 8 is an illustration of a graphical user interface (GUI) showing the percentage of code in the analysis region compared to the MPAR according to one embodiment of the present invention. The panel on the left 804 provides a quick summary for the coverage information for each instance of modules in the design. The present invention efficiently captures the summary in a bar graph form 806 attached to a hierarchy tree. The bar can include any number of colors.

Figure 9:
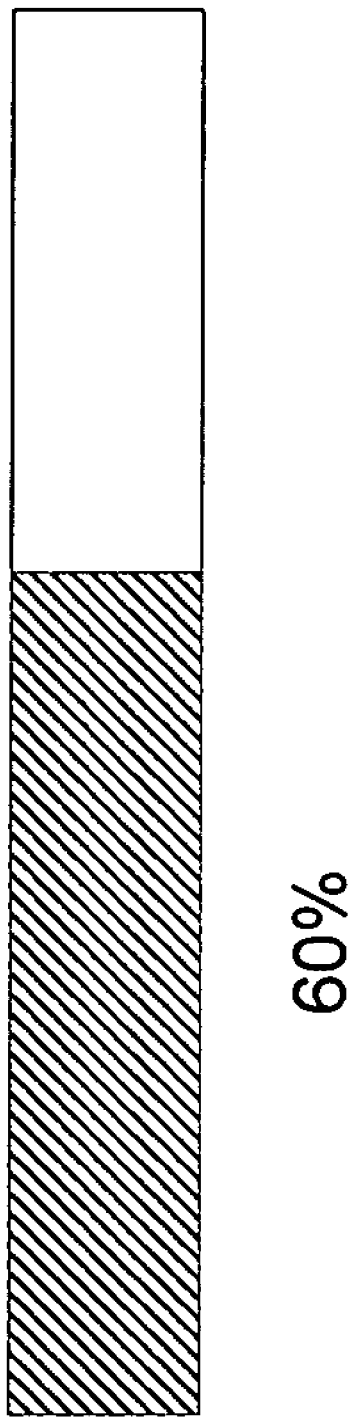
FIG. 9 is an illustration of a graphical user interface (GUI) in a bar graph format showing the percentage of code in the analysis region compared to the MPAR according to one embodiment of the present invention.

FIG. 9 is a detailed illustration of a graphical user interface (GUI) in a bar graph format showing the percentage of code in the analysis region compared to the MPAR according to one embodiment of the present invention. The bar in FIG. 9 shows that sixty percent of the code inside the MPAR is in the analysis region.

The left panel 804 in FIG. 8 can include a similar same summary at the top, and the right panel 802 shows the full source code for the module instance. The non-leaf modules, such as <arb> module in the left panel 804, can show the cumulative information of all of the submodules it instantiates, e.g., arbfifo0, arbfifo1, etc. . . . . The code can be highlighted according to whether the code falls within the analysis region, within the MPAR but outside the analysis region, or outside the MPAR.

Figure 10:
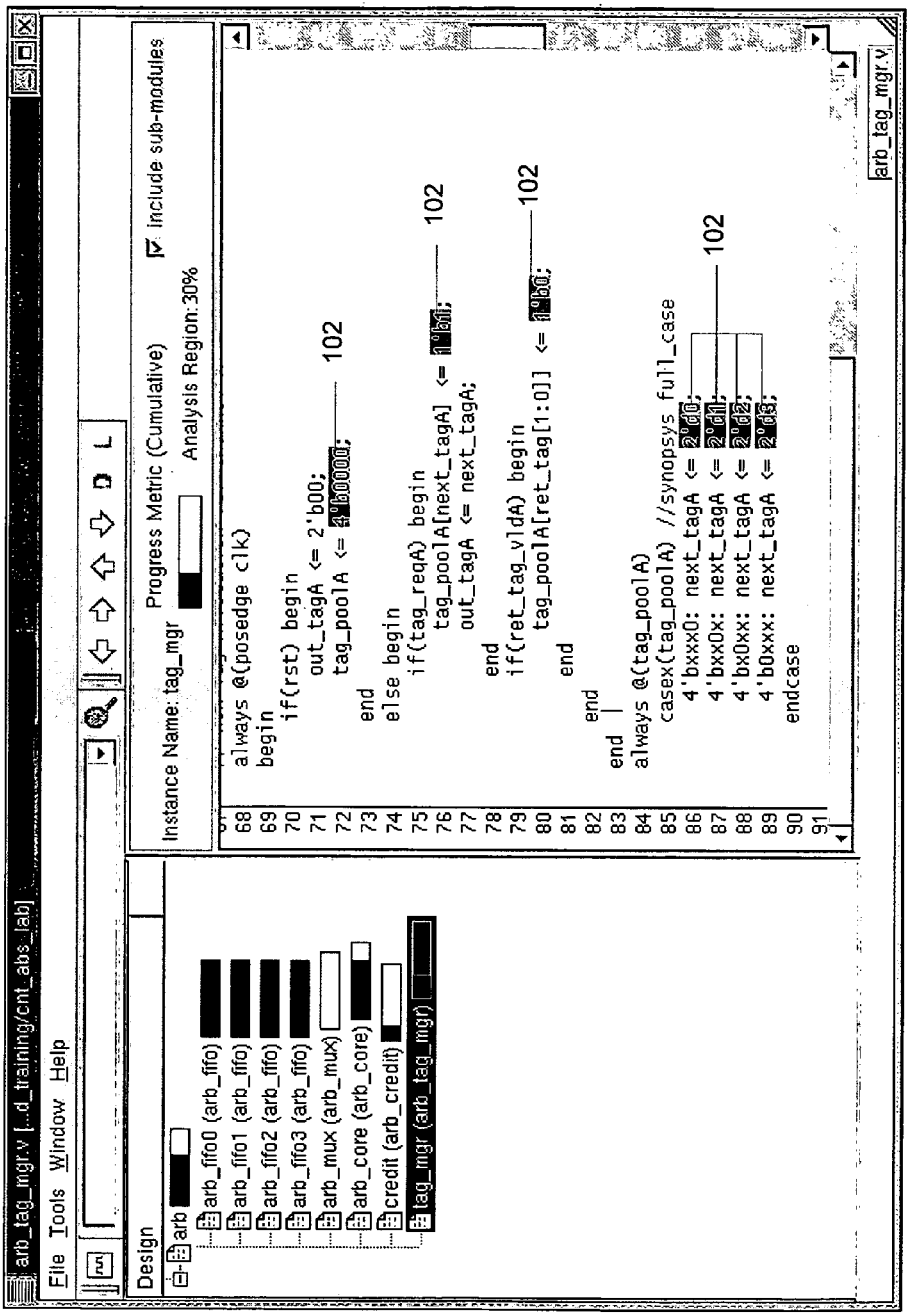
FIG. 10 is an illustration of a graphical user interface (GUI) format showing the percentage of code in the analysis region compared to the MPAR and where the code within the analysis region is highlighted according to one embodiment of the present invention.

FIG. 10 is an illustration of a graphical user interface (GUI) format showing the percentage of code in the analysis region compared to the MPAR and where the code within the analysis region is highlighted according to one embodiment of the present invention. The code in right panel represents the code in the module "tag_mgr(arb_tag_mgr)". The screen display in FIG. 10 shows some of the code highlighted 102 that represents that the code is within the analysis region.

Figure 11:
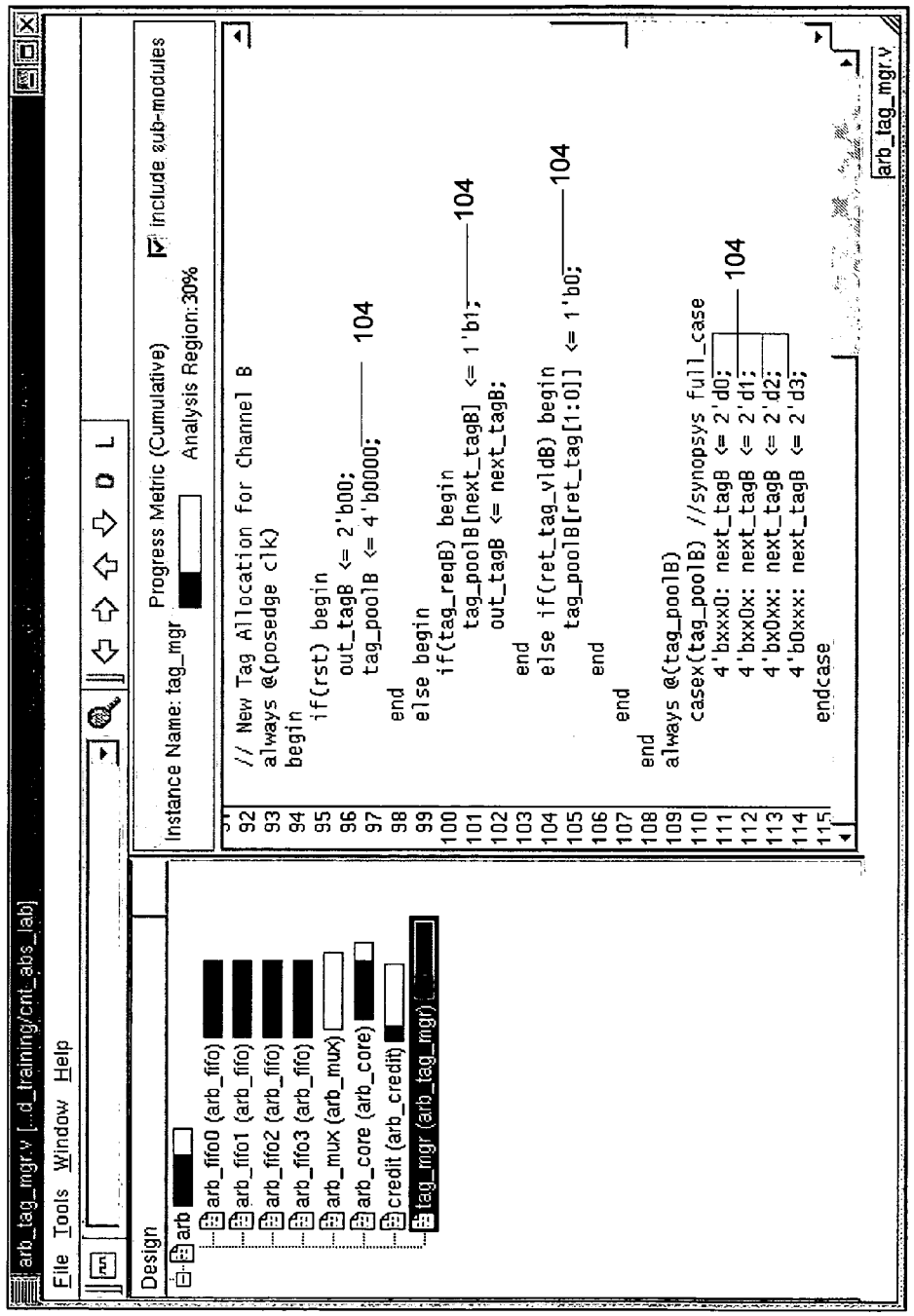
FIG. 11 is an illustration of a graphical user interface (GUI) showing the percentage of code in the analysis region compared to the MPAR and where the code within the MPAR is highlighted according to one embodiment of the present invention.

FIG. 11 is an illustration of a graphical user interface (GUI) showing the percentage of code in the analysis region compared to the MPAR and where the code within the MPAR is highlighted 104 according to one embodiment of the present invention. The analysis region can be highlighted in one color 102, and the MPAR can be highlighted in another 104. The portion that is not in the MPAR can be highlighted in another color, e.g., red, to indicate that more requirements might be needed, or that the design is over-constrained.

Figure 12:
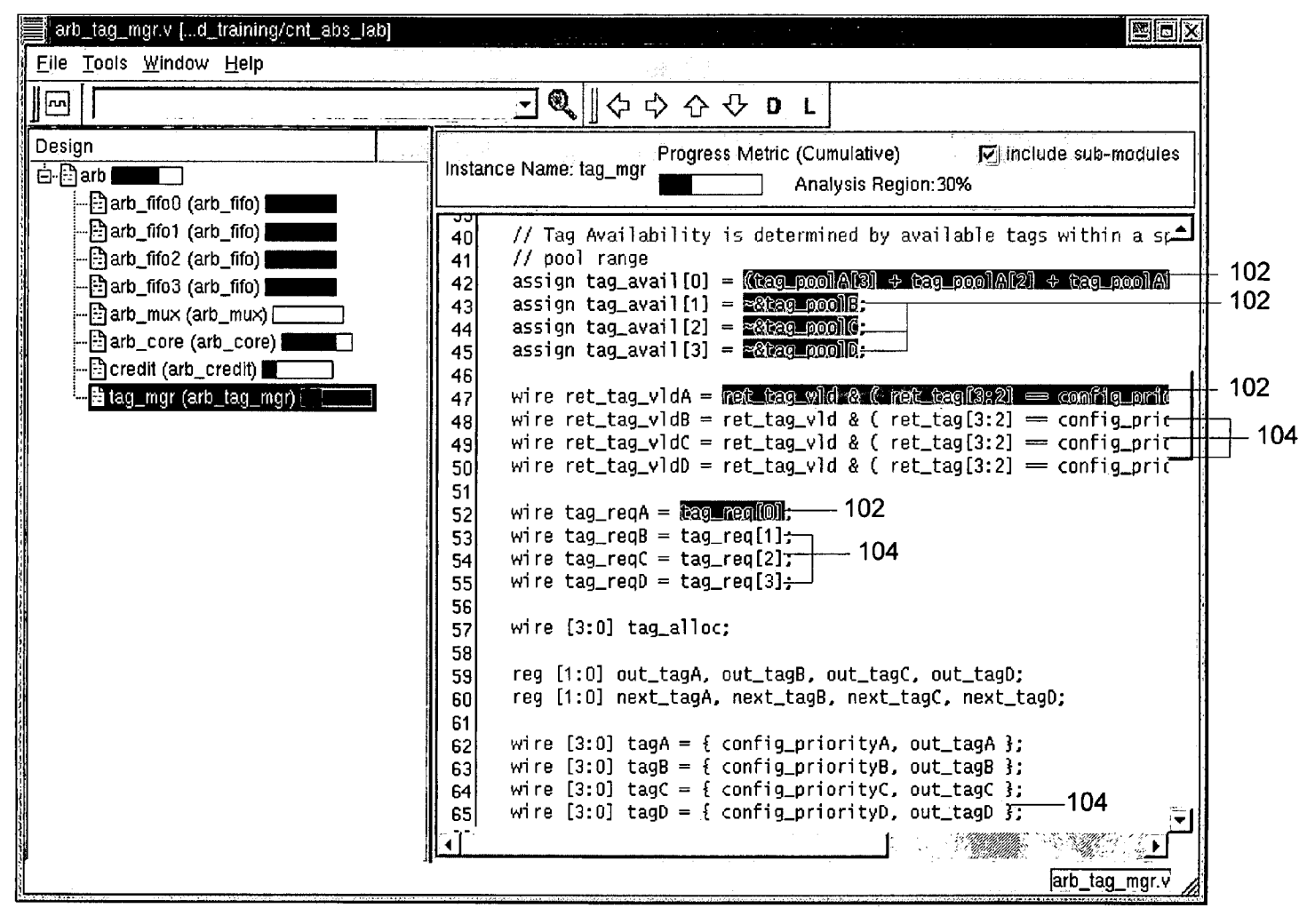

FIG. 12 is an illustration of a graphical user interface (GUI) showing the percentage of code in the analysis region compared to the MPAR and where the code in the submodules is identified as being in the analysis region 102, outside the analysis region but inside the MPAR 104 or in neither using highlighted text according to one embodiment of the present invention. In this embodiment the code that is not in the MPAR is not highlighted, but in alternate embodiments this could be highlighted in a different color or in some other manner, e.g., using colored text.

This information as provided by the shown screen shots provides appropriate guidance to the user to complete the current proof. For example, the user can identify the progress toward reaching the maximum possible analysis region by looking at the bar graph. The user can roughly estimate the remaining effort that might be required, in the worst case, to complete the proof. Using this information, the user can decide whether he wants to continue verifying the design using the current formal verification method. In addition, the user can analyze the code in the various modules to identify those portions of the design that have been analyzed when verifying the one or more properties of interest.

Figure 13:
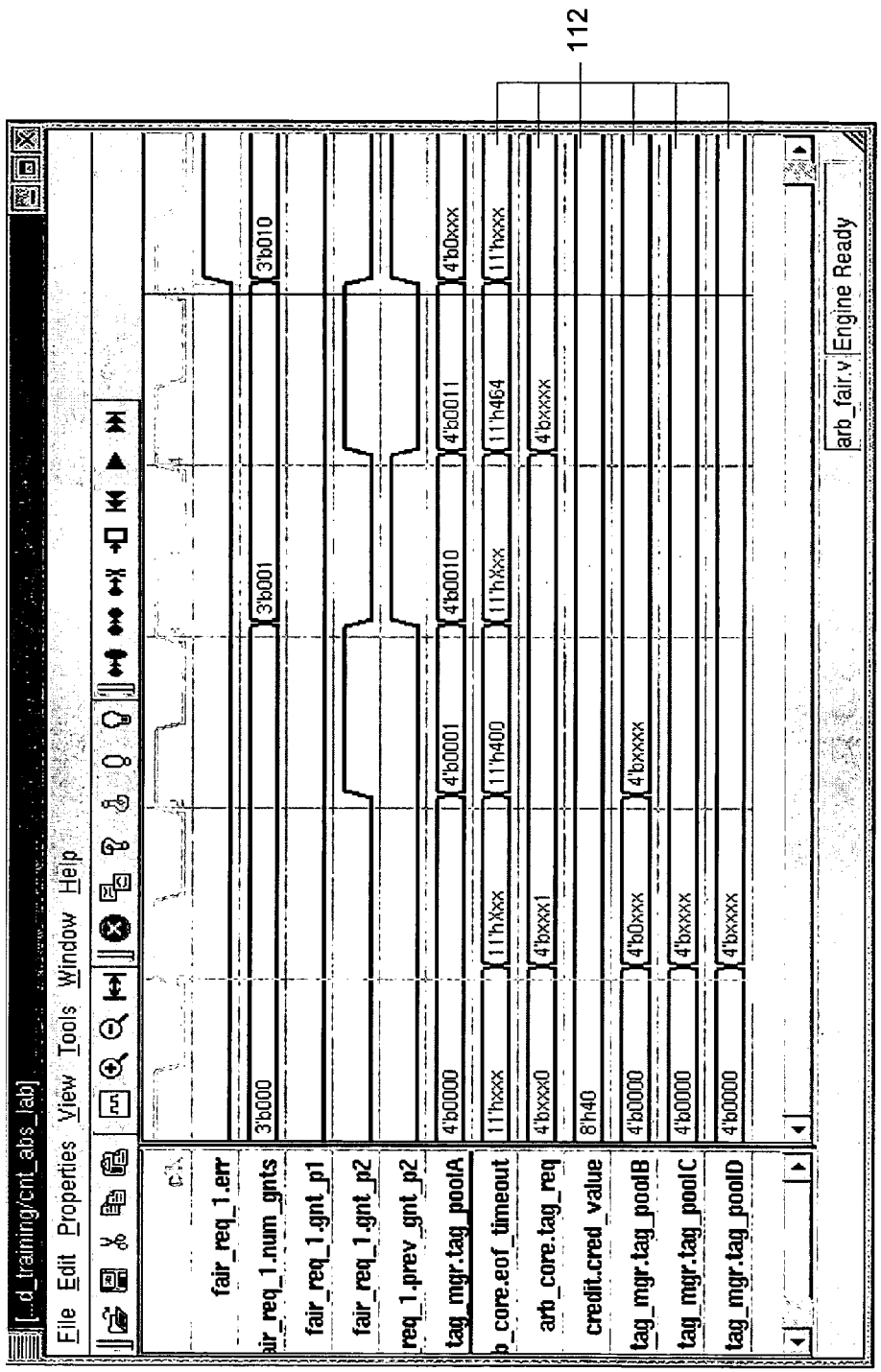
FIG. 13 is an illustration of a graphical user interface (GUI) showing the waveform of various signals being analyzed while identifying whether each signal is in the analysis region, outside the analysis region but inside the MPAR or in neither according to one embodiment of the present invention.

FIG. 13 is an illustration of a graphical user interface (GUI) showing the waveform of various signals being analyzed while identifying whether each signal is in the analysis region, outside the analysis region but inside the MPAR or in neither according to one embodiment of the present invention. The lower signals 112 in FIG. 13 can be in a different color to indicate that the signals are located at the boundary of the analysis region, and outside the AR but inside the AR. The user can easily identify these signals in the waveform, and choose to add them to expand the AR.

The present invention provides progress information toward the completion of the proof for one or more properties/requirements of interest. The logic highlighted 102 as within the analysis region has been analyzed. Examining the code may indicate a bug in the design. The logic highlighted as being outside the MPAR has no effect on the requirement. Examining this code will not help the user to detect a bug with respect to the requirement or to complete the proof.

The logic identified 104, e.g., highlighted, as being within the MPAR but not within the analysis region has not been analyzed by the existing analysis. If the user believes the design satisfies the requirement, then examining the code may help the user determine what signals to add to the analysis region and complete the proof. As a result, the smaller the portion of the logic that is identified 104 as within the MPAR but not within the analysis region, the closer the user is in the completion of all modification of the analysis region. This provides a method and apparatus to guide the formal verification process of the current requirement.

It would be relatively easy to create requirements to have full MPAR coverage (similar to one hundred percent line coverage for the set of simulation testbench). However, for critical blocks, attempting to achieve full analysis region coverage leads to a higher confidence in the functional correctness of the complete block. For mission critical blocks, the analysis region for individual property can also be tuned to be as small as possible while keeping the requirements at a high-level of abstraction. The fact that an analysis region should be tuned to be as small as possible and yet the cumulative analysis region coverage for all of the properties should approach one hundred percent provides a balance in which the user may use as a guide in tracking the progress toward full coverage.

It will be apparent that instead of highlighting, other types of identification or marking, e.g., displaying text in various colors, bolding, italicizing, using arrows, can be used without departing from the scope of the present invention. In addition, alternate embodiments of the present invention contemplates displaying the percentage of the AR to MPAR by one or more of a variety of techniques, such as a bar graph, pie chart, ratio, etc.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A computer based method for identifying verification progress information from an analysis region for one or more properties to be verified in a circuit model verification environment comprising the steps of:
   identifying a maximum potential analysis region for said one or more properties, said maximum potential analysis region including fan-in signals for said one or more properties to be verified;
   determining verification progress information representing said analysis region with reference to said maximum potential analysis region; and
   displaying said verification progress information;
   wherein said analysis region is a subset of said maximum potential analysis region, an amount of fan-in signals for said one or more properties to be verified in the analysis region being equal or less than the amount of fan-in signals for said maximum potential analysis region.

2. The method of claim 1, wherein said progress information includes an indication of the size of the analysis region compared to the size of the maximum potential analysis region.

3. The method of claim 2, further comprising the step of:
   modifying said analysis region;
   computing verification progress information representing said analysis region with reference to said maximum potential analysis region; and
   displaying verification progress information representing said modified analysis region with reference to said maximum potential analysis region.

4. The method of claim 1, wherein said progress information includes an indication of which portion of a circuit model code is part of said analysis region.

5. The method of claim 1, wherein said progress information includes at least one of an indication of which portion of a circuit model code is part of said analysis region or whether said circuit model code is not part of said analysis region but is part of said maximum potential analysis region.

6. The method of claim 1, wherein said progress information includes an indication in a waveform of one or more signals about whether said one or more signals are not part of said analysis region but are part of said maximum potential analysis region.

7. The method of claim 1, further comprising the step of:
   modifying said analysis region;
   computing verification progress information representing said modified analysis region with reference to said maximum potential analysis region; and
   displaying verification progress information representing said modified analysis region with reference to said maximum potential analysis region.

8. The method of claim 7, wherein said step of modifying said analysis region is performed iteratively.

9. The method of claim 8, wherein said step of modifying said analysis region is performed automatically.

10. The method of claim 8, wherein said step of modifying said analysis region is performed manually.

11. The method of claim 1, further comprising the step of:
   displaying a first portion of said circuit model that is not verified using said one or more properties.

12. A computer based system for identifying verification progress information from an analysis region for one or more properties to be verified in a circuit model verification environment comprising:
   First identification means for identifying a maximum potential analysis region for said one or more properties, said maximum potential analysis region including fan-in signals for said one or more properties to be verified;
   verification progress means for determining verification progress information representing said analysis region with reference to said maximum potential analysis region; and
   display means for displaying said verification progress information;
   wherein said analysis region is a subset of said maximum potential analysis region, an amount of fan-in signals for said one or more properties to be verified in the analysis region being equal or less than the amount of fan-in signals for said maximum potential analysis region.

13. The system of claim 12, wherein said progress information includes an indication of the size of the analysis region compared to the size of the maximum potential analysis region.

14. The system of claim 13, further comprising:
   modification means for modifying said analysis region;
   wherein said determining means computes said verification progress information representing said modified analysis region with reference to said maximum potential analysis region; and
   wherein said display means displays verification progress information representing said modified analysis region with reference to said maximum potential analysis region.

15. The system of claim 12, wherein said progress information includes an indication of which portion of a circuit model code is part of said analysis region.

16. The system of claim 12, wherein said progress information includes at least one of an indication of which portion of a circuit model code is part of said analysis region or whether said circuit model code is not part of said analysis region but is part of said maximum potential analysis region.

17. The system of claim 12, wherein said progress information includes an indication in a waveform of one or more signals about whether said one or more signals are not part of said analysis region but are part of said maximum potential analysis region.

18. The system of claim 12, further comprising:
   modification means for modifying said analysis region;
   wherein said determining means computes said verification progress information representing said modified analysis region with reference to said maximum potential analysis region; and
   wherein said display means displays said verification progress information representing said modified analysis region with reference to said maximum potential analysis region.

19. The system of claim 18, wherein said modification means modifies said analysis region iteratively.

20. The system of claim 19, wherein said modification means modifies said analysis region automatically.

21. The system of claim 19, wherein said modification means modifies said analysis region manually.

22. The system of claim 12, wherein said display means displays a first portion of said circuit model that is not verified using said one or more properties.

* * * * *